US009064915B2

(12) United States Patent
Kubo et al.

(10) Patent No.: US 9,064,915 B2
(45) Date of Patent: Jun. 23, 2015

(54) SUPPORT METHOD, HIGH-TEMPERATURE TREATMENT METHOD USING SAME, AND SUPPORT JIG

(75) Inventors: Atsushi Kubo, Kawasaki (JP); Hirofumi Imai, Kawasaki (JP); Koki Tamura, Kawasaki (JP); Takahiro Yoshioka, Kawasaki (JP)

(73) Assignee: Tokyo Ohka Kogyo Co., Ltd., Kawasaki-Shi (JP)

( * ) Notice: Subject to any disclaimer, the term of this patent is extended or adjusted under 35 U.S.C. 154(b) by 418 days.

(21) Appl. No.: 13/404,254

(22) Filed: Feb. 24, 2012

(65) Prior Publication Data
US 2012/0217210 A1   Aug. 30, 2012

(30) Foreign Application Priority Data

Feb. 28, 2011   (JP) ................. 2011-042954

(51) Int. Cl.
*H01L 21/00*  (2006.01)
*H01L 21/673*  (2006.01)
*H01L 21/687*  (2006.01)

(52) U.S. Cl.
CPC ...... *H01L 21/67309* (2013.01); *H01L 21/6875* (2013.01)

(58) Field of Classification Search
None
See application file for complete search history.

(56) References Cited

U.S. PATENT DOCUMENTS

| 5,718,574 | A  | * | 2/1998  | Shimazu         | 432/253 |
| 6,497,403 | B2 | * | 12/2002 | Ries            | 269/266 |
| 7,204,887 | B2 | * | 4/2007  | Kawamura et al. | 118/725 |
| 2003/0013273 | A1 |  | 1/2003  | Naruoka et al.  |         |
| 2010/0200962 | A1 |  | 8/2010  | Kihara          |         |
| 2010/0282170 | A1 | * | 11/2010 | Nishizawa       | 118/728 |

FOREIGN PATENT DOCUMENTS

| JP | 09186230   | 7/1997 |
| JP | 2003-031779 | 1/2003 |
| JP | 2003037112 | 2/2003 |
| JP | 2005-101310 | 4/2005 |
| JP | 2008-098589 | 4/2008 |

OTHER PUBLICATIONS

Office Action in Corresponding Japanese Patent Application No. 2011-042954 dated Sep. 30, 2014.
Korean Office Action dated Feb. 23, 2015 for Korean Application No. 10-2012-0019436.

\* cited by examiner

*Primary Examiner* — Charles Garber
*Assistant Examiner* — Evren Seven
(74) *Attorney, Agent, or Firm* — Knobbe Martens Olson & Bear LLP

(57) ABSTRACT

A method for supporting a support to which a wafer is attached, by supporting the support against gravitational force by supporting three or more support points of an inner circumference section of a support surface of the support. The support surface of the support is opposite to a side on which the wafer is attached to the support.

6 Claims, 10 Drawing Sheets

F I G. 1
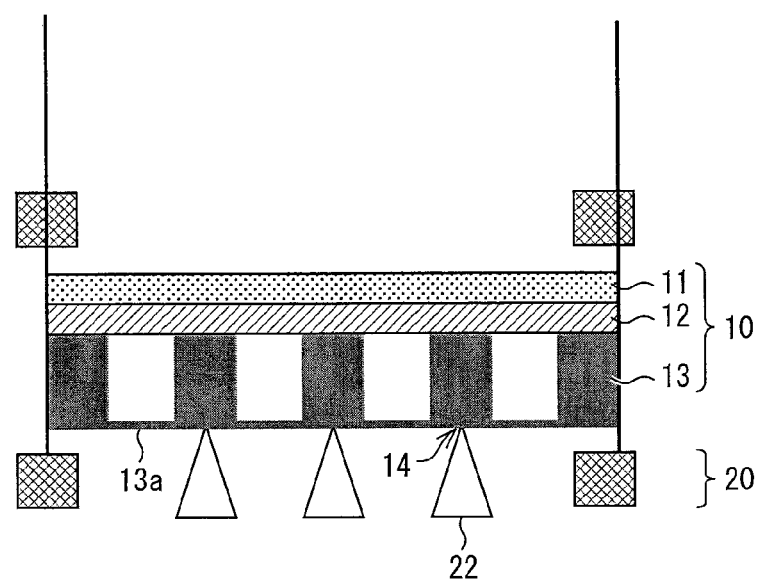

F I G. 1 6
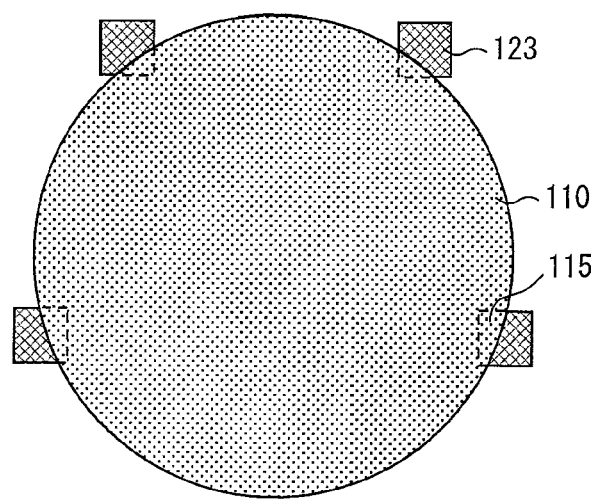

SUPPORT METHOD, HIGH-TEMPERATURE TREATMENT METHOD USING SAME, AND SUPPORT JIG

This Nonprovisional application claims priority under 35 U.S.C. §119(a) on Patent Application No. 2011-042954 filed in Japan on Feb. 28, 2011, the entire contents of which are hereby incorporated by reference.

TECHNICAL FIELD

The present invention relates to (i) a support method for supporting a support substrate to which a wafer is attached, (ii) a high-temperature treatment method in which the support method is used, and (iii) a support jig.

BACKGROUND ART

Recently, there has been increased demand that semiconductor silicone chips provided in devices such as a mobile phone, a digital audio-video equipment, and an IC card are smaller, thinner, and more highly-integrated, in view of advancement of multi-functioning of the devices.

A thin chip is manufactured by (i) preparing a wafer by slicing a material such as high-purity silicon monocrystal and (ii) providing a semiconductor on a reverse-side surface of the wafer. In a providing step of the semiconductor, a heat treatment is carried out during a step such as a curing step of an insulating film. In the heat treatment, there is a case that the wafer is exposed to high temperature of higher than 200° C.

Patent Literature 1 discloses a support method and a support jig each of which supports a wafer during a heat treatment. According to the support method of the patent literature 1, a wafer whose crystal orientation is of <110> is supported on the following parts (i) and (ii) of a reverse-side surface, (i) a fan-shaped wafer surface part which ranges from 40 to 60 degrees with respect to a center point of the wafer and a direction extending from the center point of the wafer toward orientation of <100> in parallel with a surface of the wafer and (ii) fan-shaped wafer surface parts obtained by rotating the fan-shaped wafer surface part (i) at intervals of 90 degrees.

CITATION LIST

Patent Literature

Patent Literature 1
Japanese Patent Application Publication, Tokukai, No. 2008-98589 A (Publication Date: Apr. 24, 2008)

SUMMARY OF INVENTION

Technical Problem

It is necessary that a wafer be thinned by grinding in response to the demand for the reduction in size and thickness of the chip. In some case, the wafer is attached to a support (hereinafter also referred to as "support substrate") by use of an adhesive agent or the like prior to thinning, so that the wafer can be prevented from being broken. In some cases, the wafer that is thinned in this manner is subjected to the heat treatment while still being kept attached to the support.

However, the patent literature 1 is silent about a method for supporting a support to which a wafer is attached.

A method in which a support is supported on three or four parts of an outer circumference can be thought as the method for supporting a support to which a wafer is attached. Each of FIGS. 15 and 16 shows an example in which the support is supported by the method. Each of FIGS. 15 and 16 is a view describing a conventional method for supporting a support.

In an example shown in FIGS. 15 and 16, a laminate 110 in which a wafer 111 is attached to a support 113 via an adhesive layer 112 is supported on four points (support points 115) of the laminate 110 which points are located on an outer circumference of the support 113. The conventional method is a method in which a support jig 120 that includes outer-circumference supporting sections 123 supports the laminate 110, for example. FIG. 15 is a cross sectional view showing the laminate 110 from a lateral side. FIG. 16 is a plan view showing the laminate 110 from above.

However, in a case where the laminate 110 is supported by the method, a central part of the laminate 110 is bent by self-weight stress caused by weights of the support 113 and the adhesive layer 112.

Particularly, in a case where a wafer having a large diameter of larger than 300 mm is used, there is an increased risk for great bending. If the wafer, which is attached to a laminate being bent as such, is cooled after a heat treatment, then the wafer is greatly curled. Such great curling of the wafer leads to problems in a following process, such as a failure to carry the wafer by a robot arm, a vacuum chuck error, and defocusing at time of irradiation. This poses a serious problem for progressing in the process.

The present invention is made in view of the problem, and an object of the present invention is to provide a support method, a high-temperature treatment method, and a support jig in each of which it is possible to prevent curling of a wafer.

Solution to Problem

In order to attain the object, a support method of the present invention is a support method for supporting a support substrate to which a wafer is attached, the support method including the step of supporting the support substrate against gravitational force by supporting three or more support points of an inner circumference section of a support surface of the support substrate, where the support surface is an opposite side of a side on which the wafer is attached to the support substrate.

Further, it is preferable that the support method of the present invention is arranged so that at least three of the three or more support points are arranged at regular intervals on a circumference of a circle concentric with a circular shape of the support surface.

Further, it is preferable that a support method of the present invention is a support method for supporting a support substrate to which a wafer is attached, the support method including the step of supporting the support substrate against gravitational force by supporting (i) one or more support points of an inner circumference section of a support surface of the support substrate, and (ii) two or more support points of an outer circumference section of the support surface of the support substrate, where the support surface is an opposite side of a side on which the wafer is attached to the support substrate.

Further, it is preferable that the support method of the present invention is arranged so that one of the one or more support points of the inner circumference section is located at a center point of a circular shape of the support substrate.

In order to attain the object, a high-temperature treatment method of the present invention includes the step of carrying out a high temperature treatment to a wafer which is attached to a support being supported by the support method as described above.

In order to attain the object, a support jig of the present invention is a support jig for supporting a support substrate by being placed to face and support a support surface of the support substrate, the support jig including: a supporting plate; three or more supporting sections, provided on the supporting plate, for supporting an inner circumference section of the support surface against gravitational force.

Further, it is preferable that the support jig of the present invention is arranged so that at least three of the three or more supporting sections are configured so as to support respective points of the support surface which points are arranged at regular intervals on a circumference of a circle concentric with a circular shape of the support surface.

Further, it is preferable that a support jig of the present invention is a support jig for supporting a support substrate by being placed to face and support a support surface of the support jig, the support jig including: a supporting plate; one or more supporting sections, provided on the supporting plate, for supporting an inner circumference section of the support surface of the support substrate against gravitational force; and two or more outer-circumference supporting sections for supporting an outer circumference section of the support surface of the support substrate against the gravitational force.

Further, it is preferable that the support jig of the present invention is arranged so that one of the one or more supporting sections is configured so as to support a center point of a circular shape of the support surface.

Further, it is preferable that the support jig of the present invention is arranged so that each of the one or more supporting sections has a tip end having such a shape that the tip end makes a point contact with the support surface.

Advantageous Effects of Invention

The present invention can provide (i) a support method, (ii) a high-temperature treatment method, and (iii) a support jig, in each of which it is possible to prevent curling of a wafer.

BRIEF DESCRIPTION OF DRAWINGS

FIG. 1

FIG. 1 is a view showing a support method in accordance with one embodiment of the present invention.

Figure 2:
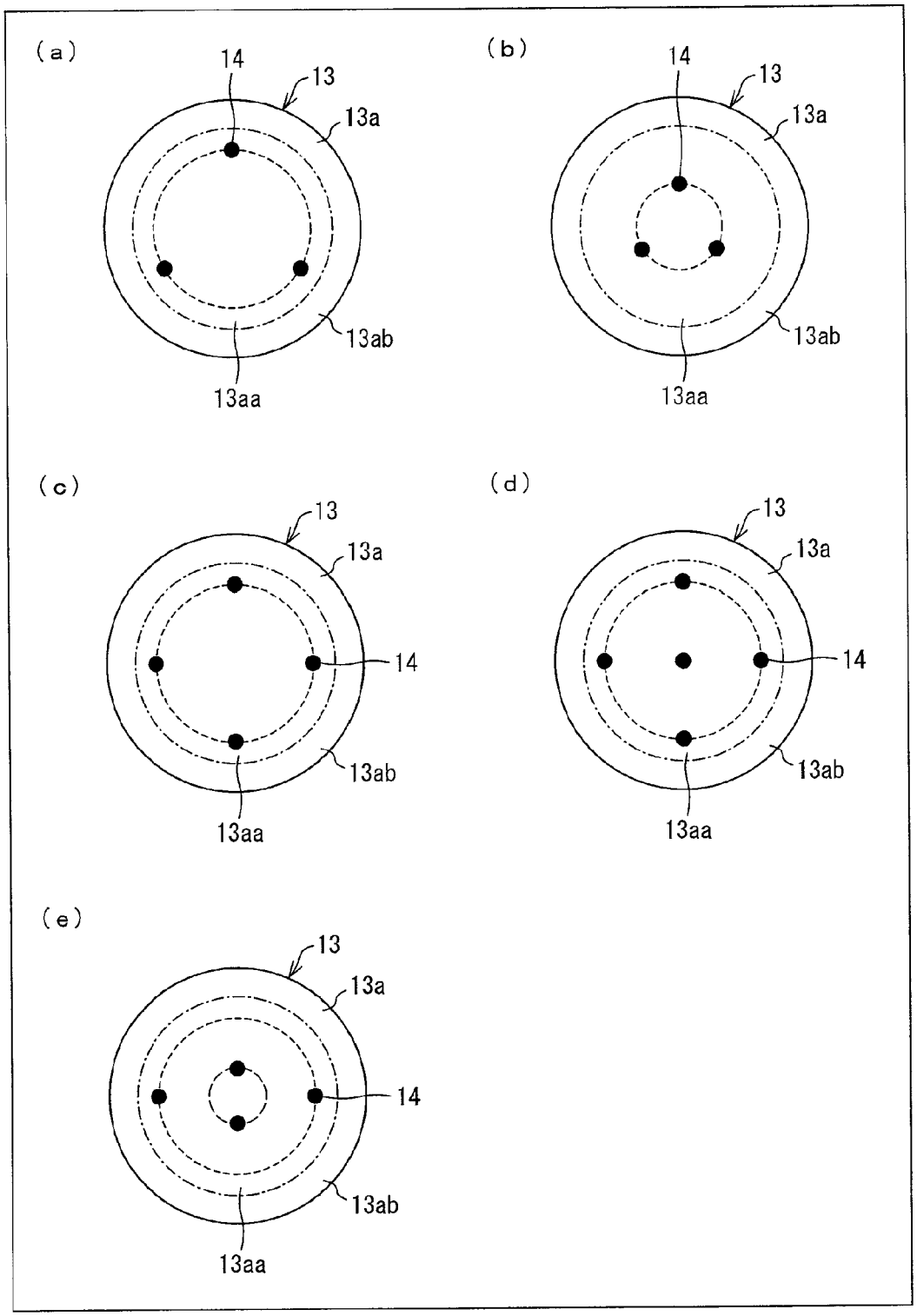
FIG. 2

Each of (a) through (e) of FIG. 2 is a view showing a corresponding example of arrangement of support points in the support method in accordance with the embodiment of the present invention.

FIG. 3

Figure 3:
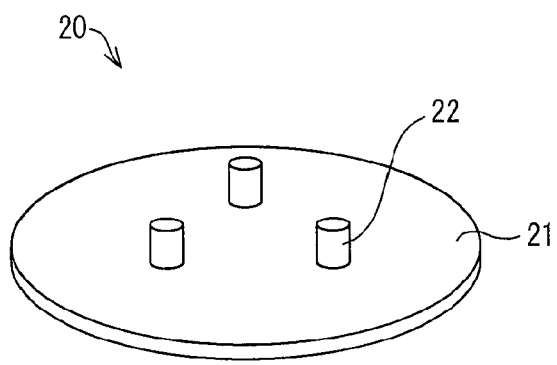

FIG. 3 is a view showing a support jig in accordance with the embodiment of the present invention.

FIG. 4

Figure 4:
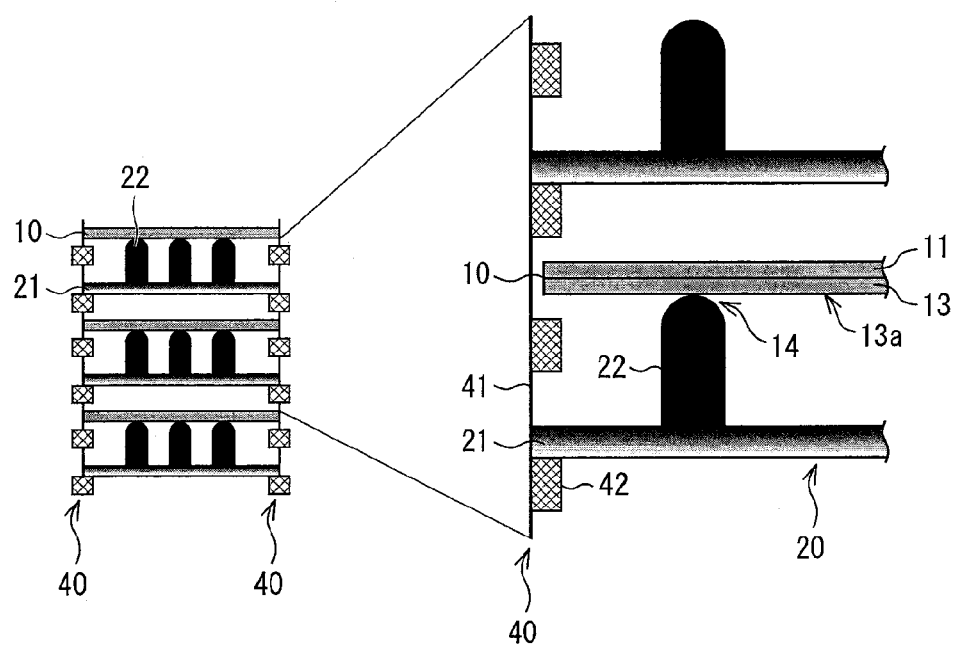

FIG. 4 is a view showing a method in which a support is supported by using the support jig of the present invention.

FIG. 5

Figure 5:
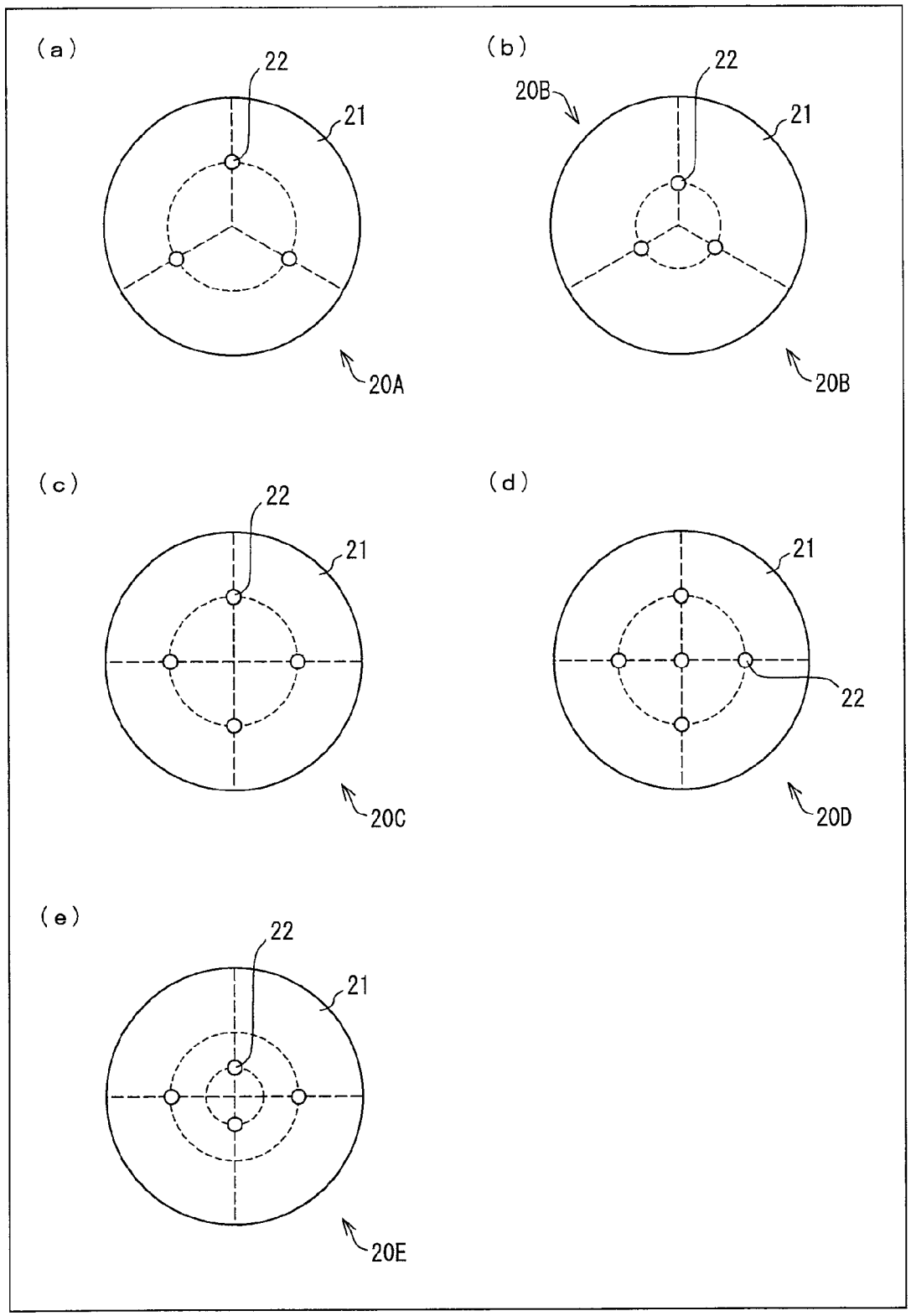

Each of (a) through (e) of FIG. 5 is a view showing a corresponding modification example of arrangement of support sections in the support jig in accordance with the embodiment of the present invention.

FIG. 6

Figure 6:
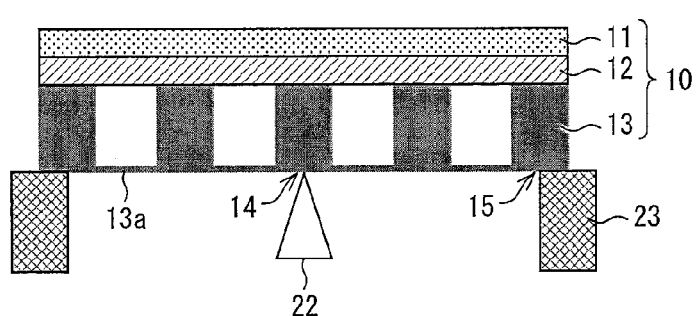

FIG. 6 is a view showing a support method in accordance with another embodiment of the present invention.

FIG. 7

Figure 7:
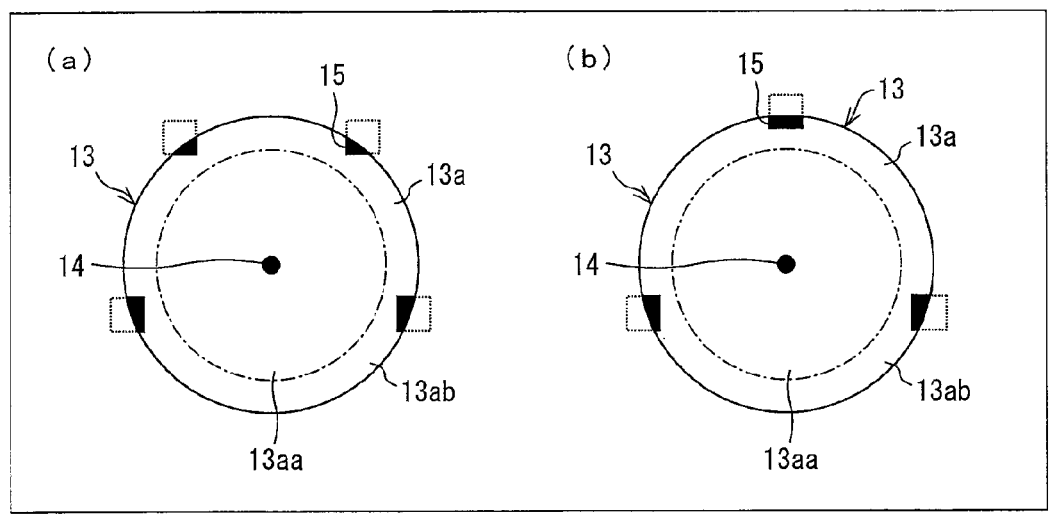

Each of (a) and (b) of FIG. 7 is a view showing a corresponding example of arrangement of support points in accordance with the embodiment of the present invention.

FIG. 8

Figure 8:
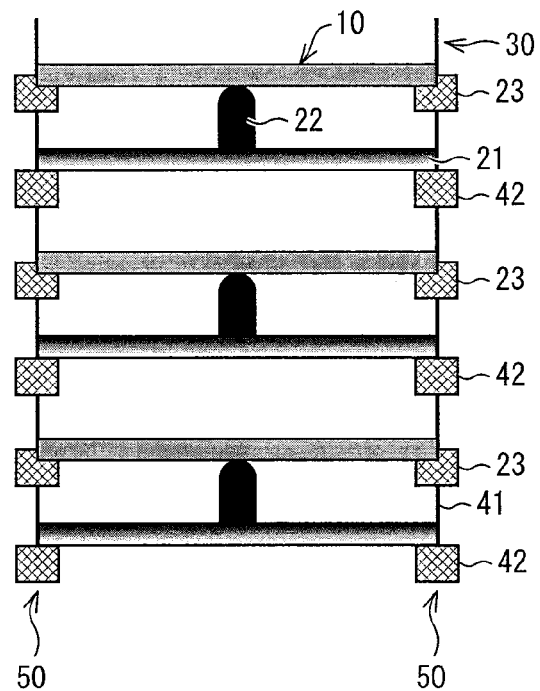

FIG. 8 is a view showing a support jig in accordance with the embodiment of the present invention.

FIG. 9

Figure 9:
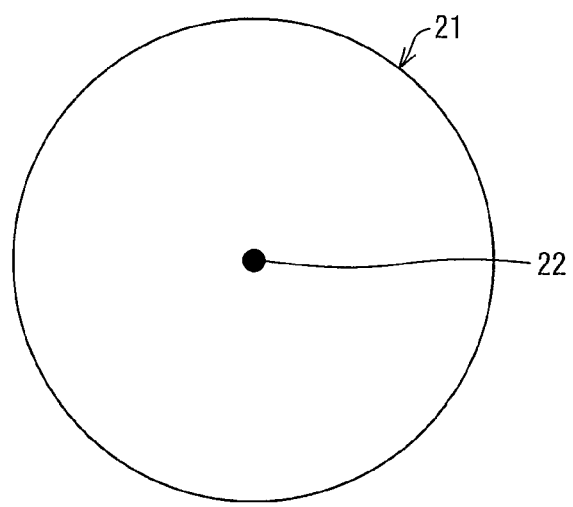

FIG. 9 is a view showing a part of the support jig shown in FIG. 8.

FIG. 10

Figure 10:
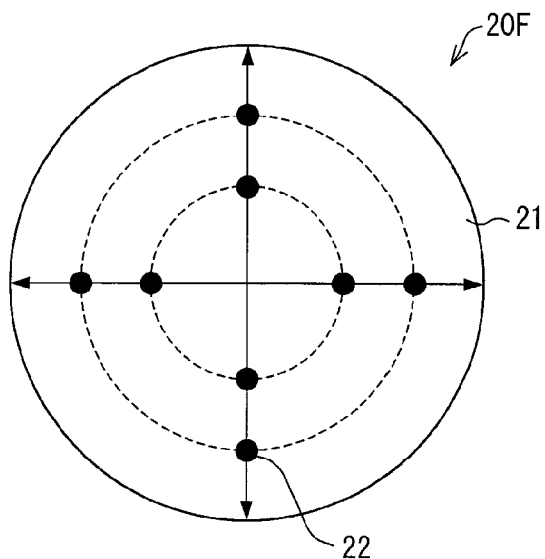

FIG. 10 is a plan view showing a configuration of the support jig in accordance with one example of the present invention.

FIG. 11

Figure 11:
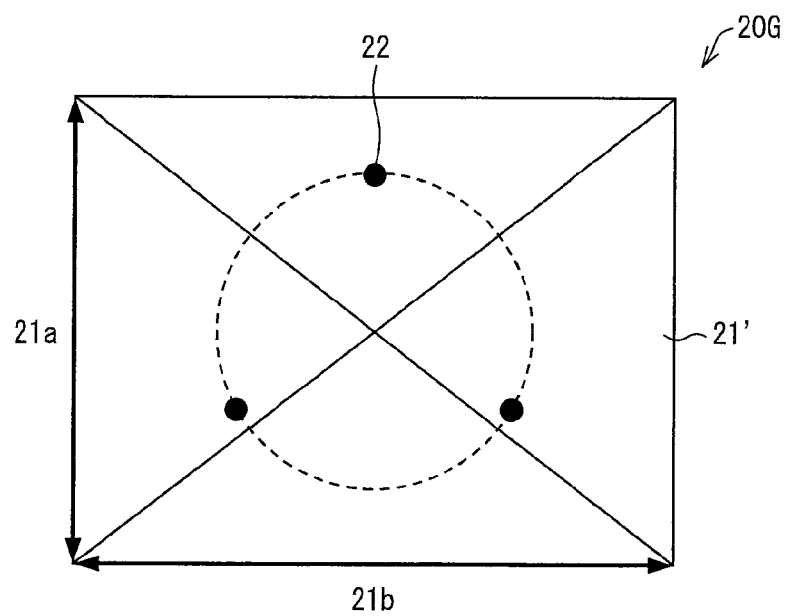

FIG. 11 is a plan view showing a configuration of a support jig in accordance with another example of the present invention.

FIG. 12

Figure 12:
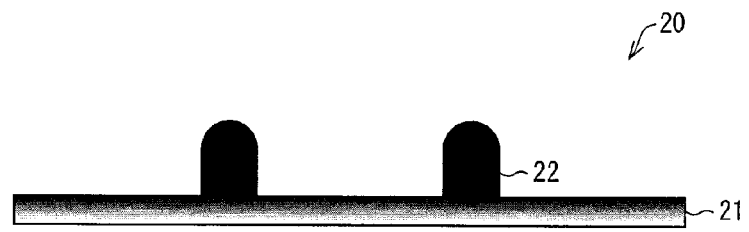

FIG. 12 is a cross sectional view showing an example of the support jig of the present invention.

FIG. 13

Figure 13:
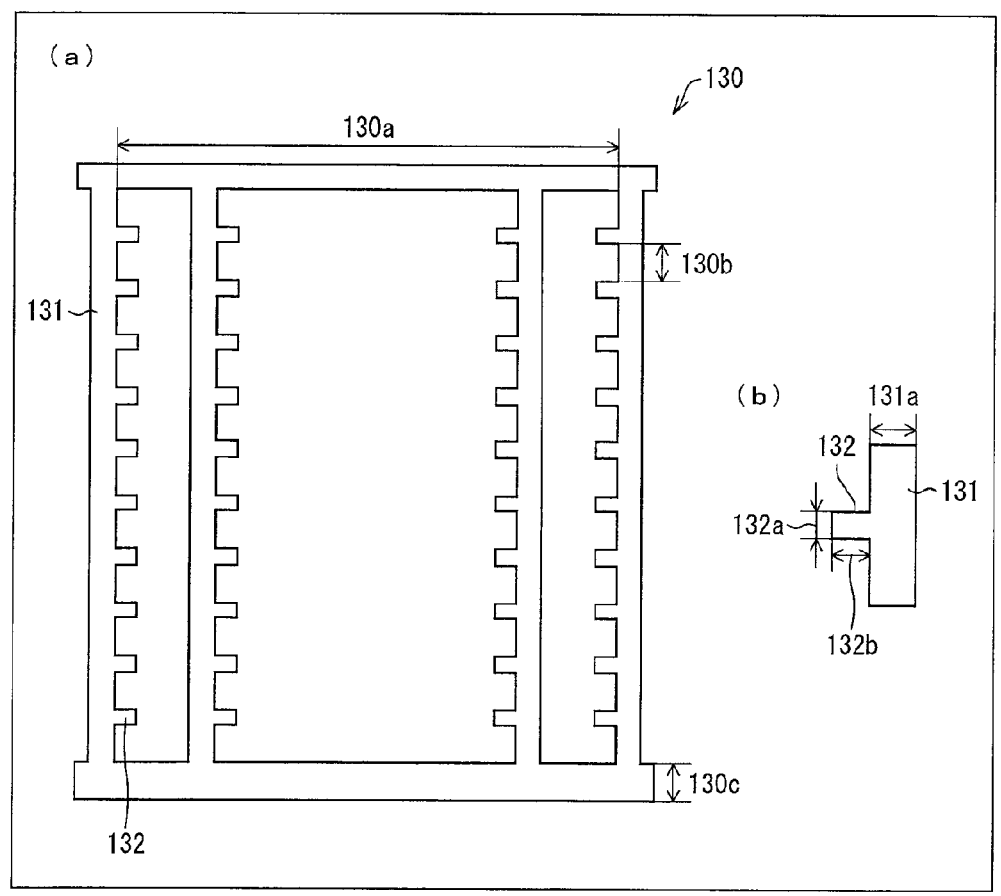

(a) of FIG. 13 is an elevation view showing one example of a conventional support jig, and (b) of FIG. 13 is a view showing a main part of the conventional support jig shown in (a) of FIG. 13.

FIG. 14

Figure 14:
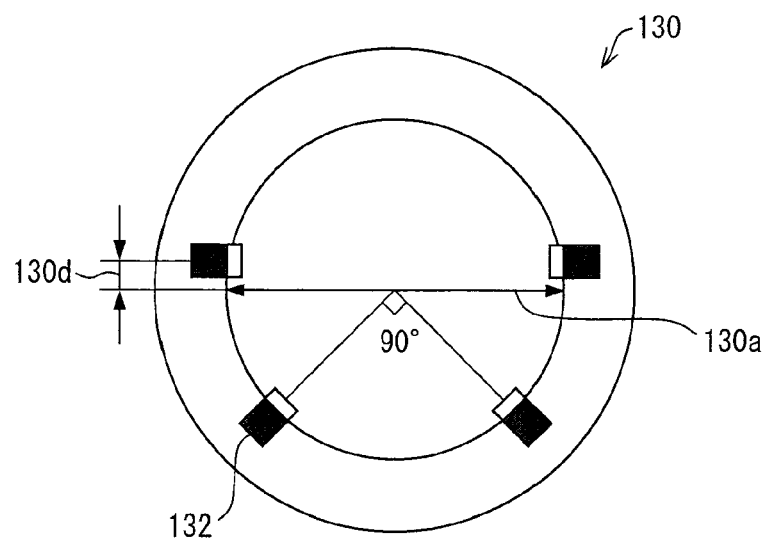

FIG. 14 is a view schematically showing a horizontal cross section of the support jig shown in (a) of FIG. 13.

FIG. 15

Figure 15:
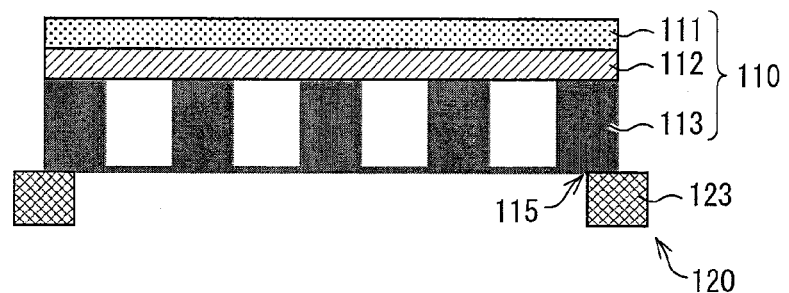

FIG. 15 is a view showing a conventional method for supporting a support.

FIG. 16

FIG. 16 is a view showing the conventional method for supporting the support.

DESCRIPTION OF EMBODIMENTS

First Embodiment

The following describes a support method and a support jig in accordance with one embodiment of the present invention.

(Outline of Support Method)

With reference to FIG. 1, the following outlines the support method in accordance with the embodiment of the present invention. FIG. 1 is a view showing the support method in accordance with the embodiment of the present invention.

The support method of the present embodiment is a support method which supports a support (support substrate) 13 to which a wafer 11 is attached. FIG. 1 shows a cross sectional view showing the support 13 from a lateral side.

The support 13 is a substrate capable of supporting the wafer 11 so that the wafer 11 is protected during a process such as, for example, grinding or the like. A substrate well known by a person skilled in the art can be used as the substrate 13, because the substrate 13 is not particularly limited as long as the substrate 13 has flexibility. Examples of a material of the substrate 13 having flexibility encompass glass, silicone, alumina, silicon carbide, aluminum, a resin, and metals such as stainless, an iron-nickel alloy, and the like.

It is suitable that the support 13 has a shape designed as appropriate in accordance with a shape of the wafer 11. The support 13 may or may not have a through-hole provided therein. The present embodiment deals with an example in which a plurality of through-holes having opening planes in both of first and second surfaces of the support 13 are provided in the support 13. In a case where a substrate having a plurality of through-holes provided therein is used as a support, as in the present embodiment, it is possible to easily dissolve an adhesive agent by feeding a dissolution solution thereto through the plurality of through-holes during a dissolution step. As a method for forming the plurality of through-holes in the support 13, a method well known by the person skilled in the art can be used.

On the other hand, in a case where a support having no through-hole is used as the support 13, a problem that the adhesive agent is subducted into a through-hole does not occur. Also, when the wafer 11 is removed from the support 13 by laser irradiation or the like, it is possible to greatly shorten time required for dissolution of the adhesive agent.

A circuit pattern is provided on a surface of the wafer 11, for example. The surface of the wafer 11 on which the circuit pattern is provided can be attached to the support 13. It is suitable that a wafer well known by and available to the person skilled in the art is used as the wafer 11. Examples of a material of the wafer 11 encompass quartz, silicone, sapphire, and a compound semiconductor such as GaAs (gallium arsenide) and the like.

The support 13 and the wafer 11 are attached to each other by the adhesive agent so as to form a laminate 10. That is, an adhesive layer 12 is provided in an interface between the support 13 and the wafer 11 by applying the adhesive agent.

It is preferable that the adhesive agent is an adhesive agent soluble in an organic solvent, such as an adhesive agent composition containing, for example, an acrylic resin, a maleimide resin, a hydrocarbon resin (which may be a cycloolefin resin, a terpene resin, or a petroleum resin, for example), and/or a novolac-type phenolic resin material, solely or in combination.

The support 13 has a support surface 13a which is an opposite surface of a surface to which the wafer 11 is attached.

In the support method of the present embodiment, an inner circumference section 13aa of the support surface 13a is supported against gravitational force. The inner circumference section 13aa indicates an inner region of the support surface 13a which inner region excludes a region near an outer circumference. In a case where the support surface 13a of the support 13 has a circular shape, it is suitable that the inner circumference section 13aa is a region of a circle, inclusive of a circumference thereof, which (i) is concentric with the circular shape of the support surface 13a and (ii) has a radius of 95% of a radius of the circular shape of the support surface 13a.

The support method of the present embodiment is a method in which the inner circumference section 13aa of the support surface 13a is thus supported. As such, even in a case where the support 13 is used to support a wafer 11 having a large size of greater than 300 mm (e.g., 450 mm or the like), it is still possible to prevent a central part of the support 13 from being bent by a self-weight stress caused by a weight of the support 13. This can prevent curling of the wafer 11.

In the present embodiment, it is preferable that the inner circumference section 13aa of the support surface 13a is supported by point supporting. As such, an area of contact between the support 13 and a member supporting the support 13 can be decreased. This allows efficient heat release during cooling of the wafer 11 after a heat treatment.

The support method of the present embodiment is described below in more detail.

(Detail of Support Method)

In the present embodiment, the support 13 is supported against gravitational force by supporting three or more points (support points 14) of the inner circumference section 13aa of the support surface 13a. From a perspective of stably supporting the support 13, it is preferable not to arrange all of the support points 14 on a same straight line. For example, the support surface 13a can be supported by supporting the support points 14 which are located at respective apexes of an imaginary polygonal shape in the inner circumference section 13aa. Supporting of the three or more support points 14 thus located makes it possible to stably support the support 13.

The number of the support points 14 is not particularly limited, as long as there are three or more support points 14. From a perspective of attaining efficient heat release during the cooling of the wafer 11 after the heating treatment, it is preferable that the number of the support points 14 is not more than ten.

(a) through (e) of FIG. 2 show examples of arrangement of the support points 14 provided in a case where the support surface 13a has the circular shape. The arrangement of the support points 14 encompasses (i) how many support points 14 are provided and (ii) where they are located. However, the present invention is not limited to these examples. Each of (a) through (e) of FIG. 2 is a view showing an example of where the support points 14 are located in the support method in accordance with one embodiment of the present invention. Each of (a) through (e) of FIG. 2 is a plan view showing the support 13 from a support-surface-13a side. In each of (a) through (e) of FIG. 2, a boundary between the inner circumference section 13aa and an outer circumference section 13ab is shown by the dotted and dashed line.

In one example of the locations of the support points 14, at least three of the three or more support points 14 are arranged at regular intervals on a circumference of a circle concentric with the support surface 13a. For example, in a case where the support surface 13a has a circular shape, a center point shared by the circle and the support surface 13a can be a center of the circular shape of the support surface 13a, whereas in a case where the support surface 13a has a polygonal shape, the center point shared by the circle and the support surface 13a can be an intersection of diagonal lines of the polygonal shape of the support surface 13a. With the arrangement, the support 13 can be stably supported.

For example, as shown in (a) through (c) of FIG. 2, the support points 14 can be three or four points of the inner circumference section 13aa of the support surface 13a which points are arranged at regular intervals on a circumference of a circle (which is shown by the dashed line in each of (a) through (c) of FIG. 2) concentric with the support surface 13a. The circle concentric with the support surface 13a may be a circle slightly smaller than the boundary between the inner and outer circumference sections 13aa and 13ab (see (a) and (c) of FIG. 2), or a circle slightly greater than the center point of the support surface 13a (see (b) of FIG. 2).

In another example of the locations of the support points 14, one of the support points 14 is located at a center point of the support surface 13a. With the arrangement, it is possible to effectively prevent the bending of the central part of the support 13.

For example, as shown in (d) of FIG. 2, the support points 14 can be (i) a point located at the center point of the support surface 13a and (ii) three or four points of the inner circumference section 13aa of the support surface 13a which points are arranged at regular intervals on an circumference of a circle (which is shown by the dashed line in (d) of FIG. 2) concentric with the support surface 13a.

Alternatively, the support points 14 may be points in the support surface 13a which points are located on circumferences of at least two respective circles (i) concentric with the support surface 13a and (ii) having different radii. In this case, it is preferable that the points thus serving as the support points 14 encompass a group of two or more points located on each of the circumferences of the respective circles. It is further preferable that the group of two or more points are arranged at regular intervals on each of the circumferences of the respective circles.

For example, the support points 14 can be groups of two points, each of which groups are arranged at regular intervals on a corresponding one of circumferences of two respective circles (which are shown by the dashed lines in (e) of FIG. 2) concentric with the support surface 13a and having different radii. In the example shown in (e) of FIG. 2, each group of two support points 14, which are located on a corresponding one of the circumferences of the circles, are located on a diametric line of the corresponding one of the circumferences of the circles. Also, the diametric line passing through one group of two support points 14 located on one of the circumferences of the circles extends orthogonally to the diametric line passing through the other group of two support points 14 located on the other one of the circumferences of the circles. With the arrangement, it is possible to stably support the support 13.

The support method of the present invention can be worked by use of the support jig of the present invention.

(Support Jig)

One embodiment of the support jig of the present invention is described below with reference to FIGS. 3 and 4. FIG. 3 is a view showing the embodiment of the support jig of the present invention. FIG. 4 is a view explaining a method in which a support is supported with the use of the support jig of the present invention. FIG. 4 shows a cross sectional view showing, from a lateral side, a support jig 20 supporting the laminate 10 including the wafer 11 and the support 13. A figure on the right in FIG. 4 is a view showing, in magnification, a main section of the support jig 20 shown in a figure on the left in FIG. 4.

The support jig 20 of the present embodiment is a support jig 20 for supporting the support 13, which support jig 20 is placed so as to face and support the support surface 13a of the support 13.

The support jig 20 includes a supporting plate 21 and supporting sections 22. The supporting plate 21 is a planar member having, but not limited to, a circular shape. The supporting plate 21 in the present invention may have a polygonal shape, for example. Also, the supporting plates 21 may have a shape identical to a shape of the support substrate or a shape different from the shape of the support substrate. Further, the supporting plate 21 may have a diameter substantially identical to a diameter of the support substrate, a diameter greater than the diameter of the support substrate, or a diameter smaller than the diameter of the support substrate.

The supporting sections 22 are members for supporting the support 13 against gravitational force. The supporting sections 22 are provided on the supporting plate 21.

It is preferable that the supporting plate 21 and the supporting sections 22 are made from a heat resistant material(s). For example, the supporting plate 21 and the supporting sections 22 can be made from quartz or the like. The supporting sections 22 can be made from a material same as a material of the supporting plate 21 or a material different from a material of the supporting plate 21. Also, the supporting sections 22 can be integrated with the supporting plate 21. The supporting sections 22 can be provided on the supporting plate 21 by welding, for example.

Tip ends of the respective supporting sections 22 touch the support surface 13a. It is preferable that the tip ends of the supporting sections 22 have such shapes that the tip ends of the respective supporting sections 22 make point contacts with the support 13. Those surfaces of the respective tip ends of the supporting sections 22, which make contacts with the support surface 13a, can be curved surfaces or flat surfaces, as long as the tip ends of the supporting sections 22 can be arranged so as to make point contacts with the support 13. For example, the tip ends of the supporting sections 22 may have round head shapes as shown in FIG. 12. FIG. 12 is a cross sectional view showing one example of the support jig 20 of the present invention.

In a case where the tip ends of the supporting sections 22 have such shapes so that they can make point contacts with the support surface 13a, it is possible that the support 13 is point-supported. This allows efficient heat release during cooling of the support 13 after high-temperature treatment.

Each of the supporting sections 22 can have (i) a body part having a columnar shape and (ii) a tip end part continuing to the body part. The body part of each of the supporting sections 22 can have the columnar shape, a cone/pyramid shape, or the like, for example. Examples of these shapes encompass a cylindrical shape, a rectangular cylindrical shape, and a cone shape, a pyramid shape. It is suitable that the tip end part of each of the supporting sections 22 has the tip end as early described. It follows that the tip end part of each of the supporting sections 22 can have a round-head shape or a taper shape tapered toward the tip end.

The supporting sections 22 are arranged so as to support the inner circumference section 13aa of the support surface 13a. That is, the supporting sections 22 are arranged so that, in a case where the support jig 20 is placed so as to face the support surface 13a, the tip ends of the respective supporting sections 22 touch the inner circumference section 13aa of the support surface 13a and thereby support the supporting plate 13, for example.

The arrangements allow the support jig 20 of the present embodiment to support the inner circumference section 13aa of the support surface 13a. As such, even in a case where the support 13 is used to support a wafer 11 having a large size, it is still possible to prevent the support 13 from being bent in its central part by self-weight stress caused by the weight of the support 13. This can prevent the curling of the wafer 11.

In the present embodiment, at least three supporting sections 22 are provided on the supporting plate 21. The supporting sections 22 are arranged so as to support at least three respective points of the inner circumference section 13aa of the support surface 13a of the support 13 against gravitational force. From a perspective of stably supporting the support 13, it is preferable that not all of the points thus supported by the respective supporting sections 22 are located on a same line.

For example, the supporting sections 22 can be arranged so as to support respective points of the inner circumference section 13aa which points are located at apexes of a polygonal shape within the inner circumference section 13aa. Also, it is preferable that the supporting sections 22 support the support points 14 which are arranged as early described. Because at least three points of the inner circumference section 13aa are thus supported in the support jig 20, the support jig 20 can stably support the support 13.

The number of the supporting sections 22 which are provided to support one support 13 is not limited to a particular number, as long as three or more supporting sections 22 are provided. From the perspective of attaining efficient heat release during the cooling of the wafer 11 after the heat treatment, it is preferable that the number of the supporting sections 22 which are provided to support one support 13 is not more than ten. Each of FIGS. 3 and 4 shows a corresponding arrangement in which three supporting sections 22 are provided.

The support jig 20 can include a longitudinal boat 40 for supporting the supporting plate 21 in a horizontal direction (see FIG. 4).

The longitudinal boat 40 includes columns 41 and supporting-plate supporting sections 42. It is preferable that the longitudinal boat 40 is made from a heat resistant material. For example, the longitudinal boat 40 can be made from quartz or the like. The columns 41 are provided around the supporting plate 21 so as to extend in a vertical direction. The longitudinal boat 40 may include three or four columns 41, for example. Each of the supporting-plate supporting sections 42 is provided in a column 41 and supports an outer circumference section of a corresponding supporting plate 21 against gravitational force. Two or more supporting-plate supporting sections 42 can be provided in each of the columns 41 so as to extend in the vertical direction.

Use of the longitudinal boat 40 makes it possible to support two or more laminates 10 in such a way that the two or more laminates 10 are arranged in the vertical direction (see FIG. 4).

Modification Example of Location of Supporting Section

Modification examples of the number and locations of the supporting sections 22 are shown in respective (a) through (e) of FIG. 5. However, the present invention is not particularly limited to them. Each of (a) through (e) of FIG. 5 is a view showing a modification example of locations of the supporting sections 22 in the one embodiment of the support jig 20 of the present invention. (a) through (e) of FIG. 5 are plan views showing support jigs 20A through 20E from above, respectively.

In example of the locations of the supporting sections 22, three or more of the supporting sections 22 are arranged at regular intervals on a circumference of a circle concentric with a circular shape of the supporting plate 21. The three or more of the supporting sections 22 thus arranged are provided so as to support respective points of the support surface 13a which points are arranged at the regular intervals on the circumference of the circle concentric with the circular shape of the support surface 13a. The arrangement allows the support jig 20 to stably support the support 13.

For example, as in the support jigs 20A, 20B, and 20C shown in (a) through (c) of FIG. 5, respectively, three or four supporting sections 22 can be arranged at regular intervals on a circumference of a circle (which is shown by the dashed line in each of (a) through (c) of FIG. 5) concentric with the supporting plate 21. The circle can have a radius of 50% of a radius of the circular shape of the supporting plate 21 (see (a) and (c) of FIG. 5) or a radius of about 33% (one third) of the radius of the circular shape of the supporting plate 21 (see (b) of FIG. 5).

In another example of the locations of the supporting sections 22, one of the supporting sections 22 is located at a center point of the supporting plate 21. The one of the supporting sections 22 is arranged so as to support the center point of a circular shape of the support surface 13a. With the arrangement, the support 13 thus supported can be effectively prevented from being bent in its central part in the support jig 20.

As in the support jig 20D shown in (d) of FIG. 5, for example, the supporting sections 22 can be located at (i) a center point of the supporting plate 21 and (ii) three or four points of the supporting plate 21 which points are arranged at regular intervals on a circumference of a circle (which is shown by the dashed line in (d) of FIG. 5) concentric with the supporting plate 21. The supporting sections 22 thus located support (i) the center point of the support surface 13a and (ii) three or four points of the inner circumference section 13aa of the support surface 13a which three or four points are arranged at regular intervals on a circumference of a circle concentric with the support surface 13a.

Alternatively, the supporting sections 22 may be located on circumferences of respective two or more circles concentric with the supporting plate 21 and having different radii, for example. The supporting sections 22 thus located are arranged so as to support respective points of the inner circumference section 13aa of the support surface 13a which points are arranged at regular intervals on circumferences of respective two or more circles concentric with the support surface 13a and having different radii. In this case, it is preferable that a group of two or more supporting sections 22 are provided on each of the circumferences of the respective circles. It is more preferable that the group of two or more supporting sections 22 are arranged at regular intervals on each of the circumferences of the respective circles.

For example, as in the support jig 20E shown in (e) of FIG. 5, a group of two supporting sections 22 can be arranged at regular intervals on each of circumferences of two respective circles (which are shown by the respective dashed lines in (e) of FIG. 5) concentric with the supporting plate 21 and having different radii. Each of the groups of two supporting sections 22 thus arranged support a corresponding group of two points of the inner circumference section 13aa of the support surface 13a which group are arranged at regular intervals on a corresponding one of circumferences of two respective circles concentric which with the support surface 13a and having different radii.

In the example shown in (e) of FIG. 5, each of the groups of two supporting sections 22 thus arranged on the corresponding one of the circumferences of the respective circles are located on respective intersections of (i) the corresponding one of the circumferences of the respective circles and (ii) a straight line passing through a center point of corresponding one of the circles. Further, the straight line, which passes through a corresponding one of the groups of two supporting sections 22 thus located on the corresponding one of the circumferences of the circles, extends orthogonally to the other straight line which passes through the other one of the groups of two supporting sections 22. The arrangement allows the support jig 20E to stably support the support 13.

Second Embodiment

The following describes Second Embodiment of a support method and a support jig of the present invention. In Second Embodiment, constituent components having functions similar to the constituent components of First Embodiment are given same reference numerals, and their explanation is omitted. Second Embodiment of the support method and the support jig is described mainly here as to what is different from First Embodiment of the support method and the support jig.

(Support Method)

With reference to FIG. 6 and (a) and (b) of FIG. 7, the following describes another embodiment of a support method of the present invention. FIG. 6 is a view showing the another method of the support method of the present invention. FIG. 6 shows a cross sectional view showing a support 13 from a lateral side. (a) and (b) of FIG. 7 are views showing where support points are located in accordance with the another embodiment of the present invention. Each of (a) and (b) of FIG. 7 is a view showing the support 13 from a support-surface-13a side. In each of (a) and (b) of FIG. 7, a boundary between an inner circumference section 13aa and an outer circumference section 13ab is shown by the dotted and dashed line.

The support method of the present embodiment is different from the support method of First Embodiment only in that the support method of the present embodiment supports (i) one or more points (support point(s) 14) of the inner circumference section 13aa of the support surface 13a and (ii) two or more points (support points 15) of the outer circumference section 13ab of the support surface 13a.

In the present embodiment in which the inner circumference section 13aa of the support surface 13a is thus supported, it is possible to prevent the support 13 from being bent in its central part by self-weight stress caused by a weight of the support 13, even in a case where the support 13 is used to support a wafer 11 having a large size. This makes it possible to prevent curling of the wafer 11.

The one or more support points 14 of the inner circumference section 13aa can be located at any locations in the inner circumference sections 13aa. From a perspective of effectively preventing bending of the support 13, it is preferable to locate one of the one or more supporting points 14 at a location near a center of the support surface 13a. For example, in a case where the support surface 13a has a circular shape, it is preferable that one of the one or more support points 14 is located at a center point of the circular shape of the support surface 13a.

The number of the support points 14 of the inner circumference section 13aa is not limited to a particular number, as long as there is at least one support point 14. From a perspective of attaining efficient heat release during cooling of the wafer 11 after a heat treatment, it is preferable that the number of the support points 14 is not more than ten. Locations at which the support points 14 are provided can be identical to the locations shown in the example in First Embodiment.

The outer circumference section 13ab is that part of the support surface 13a which is provided outside the inner circumference section 13aa, i.e., a region near an outer circumference of the support surface 13a. As such, the outer circumference section 13ab can be that part of the support surface 13a of the support 13 which is provided outside a circle (i) concentric with the support surface 13a of the support 13 and (ii) having a radius of 95% of a radius of the support surface 13a of the support 13.

The number of the support points 15 of the outer circumference section 13ab is not limited to a particular number, as long as two or more support points 15 are provided. Supporting of the two or more support points 15 makes it possible to prevent the bending of the support 13 and realize stable supporting of the support 13. From a perspective of attaining efficient heat release during the cooling of the wafer 11 after the heat treatment, it is preferable that the number of the support points 15 is not more than five.

It is preferable that the support points 15 of the outer circumference section 13ab are arranged so that the support 13 can be stably supported by supporting the supports points 14 and 15 of the respective inner and outer circumference sections 13aa and 13ab. From a perspective of stably supporting the support 13, it is preferable not to locate all of the support points 14 and 15 of the respective inner and outer circumference sections 13aa and 13ab on one straight line. They may be provided at respective locations within the support surface 13a which locations correspond to respective apexes of a polygonal shape.

Each of (a) and (b) of FIG. 7 shows an example of the numbers and locations of the support points 14 and 15 which example is unique to a case where the support surface 13a has a circular shape. However, the present invention is not particularly limited to the examples shown in respective (a) and (b) of FIG. 7.

In one example, as shown in (a) of FIG. 7 for example, the one or more support points 14 is one support point 14 located at a center point of the circular shape of the support surface 13, and the two or more support points 15 are four support points 15. In another example, as shown in (b) of FIG. 7 for example, the one or more support points 14 is one support point 14 located at a center point of the circular shape of the support surface 13a, and the two or more support points 15 are three support points 15.

The support points 15 may be arranged at irregular intervals in the outer circumference section 13ab, as shown in (a) and (b) of FIG. 7. That is, first spacing between a pair of two of the support points 15, which pair of two are adjacent to each other along the outer circumference of the support surface 13a, may be wider than second spacing between another pair of two of the support points 15. This may make attachment and removal of the support 13 to/from a support jig easy, depending on a shape of the support jig. However, the support points 15 are not limited to the arrangement. The support points 15 may be arranged at regular intervals in the outer circumference section 13ab.

(Support Jig)

The following describes Second Embodiment of the support jig of the present invention, with reference to FIGS. 8 and 9. FIG. 8 is a view showing Second Embodiment of the support jig of the present invention. FIG. 9 is a view showing a part of the support jig shown in FIG. 8. FIG. 8 is a cross sectional view showing, from a lateral side, a support jig 30 supporting a laminate 10 including the wafer 11 and the support 13. FIG. 9 is a plan view showing only a supporting plate 21 and a supporting section 22 of the support jig 30.

The support jig 30 of the present embodiment is different from the support jig 20 of First Embodiment particularly in that the support jig 30 of the present embodiment includes one or more supporting section 22 and two or more outer-circumference supporting sections 23. That is, the support jig 30 of the present embodiment includes the supporting plate 21, the one or more supporting sections 22, and the two or more outer-circumference supporting sections 23.

Further, the support jig 30 of the present embodiment is different from the support jig 20 of First Embodiment also in that the support jig 30 of the present embodiment includes a longitudinal boat 50 for supporting the supporting plate 21 as supported in a horizontal direction. The longitudinal boat 50 includes a plurality of columns 41, supporting-plate supporting sections 42, and outer-circumference supporting sections 23. Arrangement of the plurality of columns 41 and that of the supporting-plate supporting section 42 are identical to the respective corresponding arrangements described in First Embodiment. Also, each of the plurality of columns 41 has supporting-plate supporting sections 42 and outer-circumference supporting sections 43 arranged at alternate patterns.

In the present embodiment, at least one supporting section 22 is provided on the supporting plate 21. The supporting section 22 can be provided at any location of the supporting plate 21, as long as the supporting section 22 is arranged so as to support the inner circumference section 13aa of the support surface 13a.

In the support jig 30 of the present embodiment, the inner circumference section 13aa of the support surface 13 can be thus supported by the supporting section(s) 22. As such, even in a case where the support 13 is used to support a wafer 11 having a large size, it is still possible to prevent the central part of the support 13 from being bent by the self-weight stress caused by the weight of the support 13. This can prevent the curling of the wafer 11.

From a perspective of effectively preventing the bending of the support 13, it is preferable that one of the one or more supporting sections 22 is arranged so as to support that part of the support surface 13a which is near a center. That is, in a case where the support surface 13a has a circular shape, for example, it is preferable that one of the one or more supporting sections 22 is arranged so as to support a center point of the support surface 13a.

The number of the one or more supporting sections 22 is not limited to a particular number, as long as at least one supporting sections 22 is provided. From a perspective of attaining efficient heat release during the cooling of the wafer 11 after the heat treatment, it is preferable that the number of the one or more supporting sections 22 is ten or smaller. The locations of the respective supporting sections 22 described in the examples in First Embodiment can be suitably applied to locations of the respective supporting sections 22 in the present embodiment.

The outer-circumference supporting sections 23 are members for supporting the support 13 against gravitational force. The outer-circumference supporting sections 23 are arranged so as to support the outer circumference section 13ab of the support surface 13a. That is, the outer-circumference supporting sections 23 are arranged so as to support, when the supporting plate 21 of the support jig 30 is placed so as to face the support surface 13a, the support 13 by making contacts with the outer circumference section 13ab of the support surface 13a.

In the present embodiment, the outer-circumference supporting sections 23 are provided in each of the plurality of columns 41. However, the outer-circumference supporting sections of the present invention are not limited to the arrangement described in the present embodiment. The outer-circumference sections of the present invention may be provided directly on the supporting plate 21, for example, as long as they are arranged so as to support the outer circumference section 13ab of the support surface 13a.

The number of the outer-circumference supporting sections 23 that support one support 13 is not particularly limited, as long as two or more outer-circumference supporting sections 23 are provided. With the two or more outer-circumference supporting sections 23 thus provided, it is possible to prevent the bending of the support 13 and stably support the support 13. From a perspective of attaining efficient heat release during the cooling of the wafer 11 after the heat treatment, it is preferable that the number of the outer-circumference supporting sections 23 provided to support one support 13 is five or smaller. Further, it is more preferable that the number of outer-circumferences supporting sections 23 provided to support one support 13 is three or four. This can make a manufacturing process of the support jig 30 easy. Further, this can also make attachment and removal of the laminate 10 to/from the support jig 30 easy.

It is preferable that the outer-circumference supporting sections 23 are arranged so that the support 13 can be stably supported by supporting both the outer-circumference supporting sections 23 and the one or more supporting sections 22. From a perspective of stably supporting the support 13, it is preferable not to locate all of (i) the outer-circumference supporting sections 23 and (ii) the one or more supporting sections 22 on a same straight line.

For example, (i) the one or more supporting sections 22 and (ii) the outer-circumference supporting sections 23 may be arranged so as to support respective points of the support surface 13a which points are located at apexes of a polygonal shape within the support surface 13. It is preferable that (i) the one or more supporting sections 22 and (ii) the outer-circumference supporting sections 23 are arranged so as to support the support points 14 or 15 which are located as early described. The arrangements allow the support jig 30 to stably support the support 13.

[High-Temperature Treatment Method]

The following describes one embodiment of a high-temperature treatment method of the present invention.

The high-temperature treatment method of the present invention is a method in which high-temperature treatment is carried out to the wafer 11 attached to the substrate 13 being supported by the support method as early described. "High temperature" herein means a temperature of higher than a glass transition point of a resinous principle contained in the adhesive composition. Specifically, it is suitable that the "high temperature" is a temperature of 70° C. or higher. The "high temperature" is preferably a temperature of 120° C. or higher, more preferably a temperature of 180° C. or higher, and further preferably a temperature of 200° C. or higher. An upper limit of the "high temperature" is not particularly limited, but the upper limit of the "high temperature" is not more than 400° C. and preferably not more than 350° C.

An example of a method for carrying out the high-temperature treatment encompasses a method in which the wafer 11 that is being supported by the support method is left for a given time period in a heating machine such as an oven or the like.

It is possible to prevent the curling of the wafer 11 by carrying out the high-temperature treatment to the wafer 11 thus being supported by the support method. This makes it possible to carry on a following process with improved efficiency.

The present invention is not limited to the description of each of the embodiments, but may be altered by a skilled person in the art within the scope of the claims. An embodiment derived from a proper combination of technical means disclosed in different embodiments is also encompassed in the technical scope of the present invention.

EXAMPLES

Preparation Method of Adhesive Composition

A cycloolefin copolymer ("TOPAS" (product name) 8007, manufactured by Polyplastics Co., Ltd.) was used as a resin. The resin was dissolved in p-menthane so that a solution having a resin solid content of 25 wt % was prepared. Then, an antioxidant IR1010 (which was manufactured by BASF Co., Ltd.) was added to the solution in such an amount that antioxidant content in the solution was 5 wt % with respect to the resin solid content. In this way, an adhesive composition was prepared.

Example 1

In Example 1, a glass substrate was used as a support, and a silicone wafer having a diameter of 300 mm was used as a wafer. Also, the adhesive composition which was prepared in a manner thus described was used as an adhesive composition.

A support jig which was used in each of Examples 1 and 2 had an arrangement similar to the support jig shown in FIG. 1. For easy explanation, those members of the support jig which had functions like the functions of the support jig shown in FIG. 1 are given like reference signs in the following explanation.

First, the adhesive composition was applied to the wafer 11 by spin coating, so as to form a layer having a thickness of 80

μm. Then, the layer of the adhesive composition was baked at 100° C., 160° C., and 220° C. so as to form the adhesive layer 12. Thereafter, the support 13 was attached to the adhesive layer 12 so that the laminate 10 was prepared.

The wafer 11 in the laminate 10 was thinned by back grinding, so as to have a thickness of 50 μm.

After this, the laminate 10 was supported by the support jig whose arrangement was identical to the support jig 20A shown in (a) of FIG. 5. That is, the inner circumference section 13aa of the support surface 13a of the support 13 was three-point supported by use of the support jig 20A which included three supporting sections 22 arranged at the regular intervals on the circumference of the circle concentric with the supporting plate 21.

A quartz plate having a diameter of 300.5 mm and a thickness of 3 mm was used as the supporting plate 21. The circle on whose circumference the supporting sections 22 were provided had a diameter of 150 mm (which was 50% of a diameter of the supporting plate 21). The supporting sections 22 had heights of 9 mm. In each of the supporting sections 22, a body part had a columnar shape, and a cross section of the columnar shape of the body part had a diameter of 6 mm. A tip end of each of the supporting sections 22 had a round-head shape as shown in FIG. 12.

The laminate 10 being supported as such was heated at 200° C. for one hour in an oven. Then, the oven was turned off, and the laminate 10 was left for cooling for two hours. Thereafter, how much the laminate 10 was curled (i.e., a curling amount) was measured.

The curling amount was measured by placing the wafer 11 on a bed and measuring, by use of LK-G-30 (which was manufactured by Keyence Corporation), deflection amounts at fifty seven points in an x-y plane of the wafer 11.

Table 1 shows results obtained by the measurement in Example 1. The mark "○" in Table 1 indicates a curling amount of less than 700 μm (less curling, indicting a good outcome), whereas the mark "x" in Table 1 indicates a curling amount of 700 μm or greater (great curling, indicating a poor outcome).

TABLE 1

| | Supporting Manner | Curling Amount |
|---|---|---|
| Example 1 | three points of inner circumference section were supported (diameter of concentric circle was 50% of diameter of supporting plate) | ○ |
| Example 2 | three points of inner circumference section were supported (diameter of concentric circle was 80% of diameter of supporting plate) | ○ |
| Example 3 | three points of inner circumference section were supported (diameter of concentric circle was 90% of diameter of supporting plate) | ○ |
| Example 4 | three points of inner circumference section were supported (diameter of concentric circle was 95% of diameter of supporting plate) | ○ |
| Example 5 | eight points of inner circumference section were supported (diameters of respective concentric circles were 50% and 75% of diameter of supporting plate) | ○ |
| Example 6 | three points of inner circumference section were supported (diameter of concentric circle was 50% of diameter of supporting plate) | ○ |
| Example 7 | four points of outer circumference section and one point of inner circumference section were supported | ○ |
| Comparative Example 1 | four points of outer circumference section were supported | x |

In the present example, the curling amount was insignificant as shown in Table 1.

Example 2

In Example 2, the laminate 10 was prepared in a manner similar to a manner described in Example 1, and the wafer 11 was thinned in a manner similar to a manner described Example 1. Then, the laminate 10 was supported by the support jig whose arrangement was similar to the support jig of Embodiment 1 except for a respect that the circle on whose circumference the supporting sections 22 were provided had a diameter of 240 mm (which was 80% of the diameter of the supporting plate 21). The laminate 10 being supported as such was heated and cooled in a manner similar to a manner described in Example 1. After this, a curling amount of the laminate 10 was measured in a manner similar to a manner described in Example 1.

Table 1 shows a result obtained by the measurement in Example 2. In Example 2, the curling amount was insignificant as shown in Table 1.

Example 3

In Example 3, the laminate 10 was prepared in a manner similar to the manner of Example 1, and the wafer 11 was thinned in a manner similar to the manner of Example 1. Then, the laminate 10 was supported by a support jig whose arrangement was similar to the support jig of Example 1 except for a respect that the circle on whose circumference the supporting sections 22 were provided had a diameter of 270 mm (which was 90% of the diameter of the supporting plate 21). The laminate 10 being supported as such was heated and cooled in a manner similar to the manner of Example 1. After this, a curling amount was measured in a manner similar to the manner of Example 1.

Table 1 shows a result obtained by the measurement in Example 3. In Example 3, the curling amount was insignificant as shown in table 1.

Example 4

In Example 4, the laminate 10 was prepared in a manner similar to the manner of Example 1, and the wafer 11 was thinned in a manner similar to the manner of Example 1. Then, the laminate 10 was supported by a support jig whose arrangement was similar to the support jig of Example 1 except for a respect that the circle on whose circumference the supporting sections 22 were provided had a diameter of 285 mm (which was 95% of the diameter of the supporting plate 21). The laminate 10 being supported as such was heated and cooled in a manner similar to the manner of Example 1. After this, a curling amount was measured in a manner similar to the manner of Example 1.

Table 1 shows a result obtained by the measurement in Example 4. In Example 4, the curling amount was insignificant as shown in Table 1.

Example 5

In Example 5, the laminate 10 was prepared in a manner similar to the manner of Example 1, and the wafer 11 was thinned in a manner similar to the manner of Example 1. Then, the laminate 10 was supported by a support jig whose arrangement was similar to the support jig 20F shown in FIG. 10. FIG. 10 is a plan view showing an arrangement of one example of the support jig of the present invention.

In the support jig 20F, a group of four supporting sections 22 were arranged at regular intervals on each of circumferences of two respective circles (which are shown by the dashed lines) concentric with the supporting plate 21 and having different radii. The circles, on whose circumferences the respective groups of four supporting sections 22 were thus provided, had respective diameters of 150 mm and 225 mm (which were 50% and 75% of the diameter of the supporting plate 21, respectively).

The laminate 10 thus being supported was heated and cooled in a manner similar to the manner of Example 1. After this, a curling amount was measured in a manner similar to the manner of Example 1.

Table 1 shows a result obtained by the measurement in Example 5. In Example 5, the curling amount was insignificant as shown in Table 1.

Example 6

In Example 6, the laminate 10 was prepared in a manner similar to the manner of Example 1, and the wafer 11 was thinned in a manner similar to the manner of Example 1. Then, the laminate 10 was supported by a support jig whose arrangement was similar to the support jig 20G shown in FIG. 11. FIG. 11 is a plan view showing an arrangement of another example of the support jig of the present invention.

The support jig 20G included (i) a supporting plate 21' having a rectangular shape and (ii) three supporting sections 22. The rectangular shape of the supporting plate 21' had a length side 21a having a length of 200 mm and a width side 21b having a width of 300 mm. The three supporting sections 22 were arranged at regular intervals on a circumference of a circle (which is shown by the dashed line in FIG. 11) which was concentric with the rectangular shape of the supporting plate 21' (i.e., a center point of the circle was located at an intersection of diagonal lines of the rectangular shape of the supporting plate 21'). The circle on whose circumference the supporting sections 22 were thus provided had a diameter of 150 mm (which was 50% of the length of the width side 21b of the rectangular shape of the supporting plate 21').

The laminate 10 being supported as such was heated and cooled in a manner similar to the manner of Example 1. After this, a curling amount was measured in a manner similar to the manner of Example 1.

Table 1 shows a result obtained by the measurement in Example 6. In Example 6, the curling amount was insignificant as shown in Table 1.

Example 7

In Example 7, the laminate 10 was prepared in a manner similar to the manner of Example 1, and the wafer 11 was thinned in a manner similar to the manner of Example 1. Then, the laminate 10 was supported by a support jig whose arrangement was similar to the support jig 30 shown in FIGS. 8 and 9. The support jig used in Example 7 included (i) one supporting section 22 provided at a center point of the supporting plate 21 and (ii) four outer-circumference supporting sections 23 for supporting the outer circumference 13ab of the support surface 13a. A longitudinal boat made from quartz was used as the longitudinal boat 50.

The laminate 10 being supported as such was heated and cooled in a manner similar to the manner of Example 1. After this, a curling amount was measured in a manner similar to the manner of Example 1.

Table 1 shows a result obtained by the measurement in Example 7. In Example 7, the curling amount was insignificant as shown in Table 1.

Comparative Example 1

In Comparative Example 1, the laminate 10 was prepared in a manner similar to the manner of Example 1, and the wafer 11 was thinned in a manner similar to the manner of Example 1. Then, the laminate 10 was supported in a conventional manner.

An arrangement of a support jig 130 used in Comparative Example 1 is shown in (a) and (b) of FIG. 13 and FIG. 14. (a) of FIG. 13 is an elevation view showing one example of a conventional support jig, and (b) of FIG. 13 is a view showing a main part of the support jig shown in (a) of FIG. 13. FIG. 14 is a view schematically showing a cross section of the support jig shown in (a) of FIG. 13.

The support jig 130 was a longitudinal boat made from quartz, and included (i) four columns 131 and (ii) support holding sections 132. Each of the columns 131 included a group of ten support holding sections 132. As such, the support jig 130 was capable of holding ten laminates 10 at a time.

An inner region in which the laminate(s) 10 was held had a width 130a of a 307.5 mm which extended in a horizontal direction, and spacing 130b between (i) one of the support holding sections 132 and (ii) another of the support holding sections 132 which was adjacent to the one (i) in a vertical direction was set to 30 mm. A quartz plate forming a bottom surface of the support jig 130 had a thickness 130c of 10 mm.

Each of the columns 131 had a width 131a of 15 mm. Each of the support holding sections 132 had (i) a thickness 132a of 5 mm extending in a vertical direction and (ii) a length 132b of 10 mm extending in a horizontal direction.

In a cross section of the support jig 130 with respect to the horizontal direction, a group of four support holding sections 132, which were provided in the respective four columns 131, were arranged at irregular intervals along an outer circumference of the support jig 130 (see FIG. 14). Two of the group of four support holding sections 132 were provided so that an angle formed by the two of the group of four support holding sections 132 and a center point of the cross section of the support jig 130 was set to 90°. Remaining two of the group of four support holding sections 132, between which the former two of the group of four support holding sections 132 were provided, were arranged at respective locations which were slightly off in a same direction from corresponding intersections of a diameter (which was shown by the reference numeral "130a" in FIG. 14) of the cross section of the support jig 130 and the outer circumference of the cross section of the support jig 130. A distance 130d between (a) each of the remaining two of the group of four support holding sections 132 and (b) a corresponding one of the intersections of the diameter 130a and the outer circumference of the cross section of the support jig 130 was set to 20 mm. With the arrangement, spacing between the remaining two of the group of four support holding sections 132, which remaining two were adjacent to each other along the outer circumference of the cross section of the support jig 130, was set to a value greater than spacing between any adjacent two of the group of four support holding sections 132.

The laminate 10, which was being supported by use of the support jig 130 thus arranged, was heated and cooled in a manner similar to the manner of Example 1. After this, a curling amount was measured in a manner similar to the manner of Example 1.

Table 1 shows a result of the measurement in Comparative Example 1. In Comparative Example 1, the curling amount was significant as shown in Table 1.

INDUSTRIAL APPLICABILITY

The present invention can be applied to manufacturing of a semiconductor chip provided in a mobile phone, a digital audio-video equipment, an IC card, and the like.

REFERENCE SIGNS LIST

11: wafer
13: support (support substrate)
13a: support surface
13aa: inner circumference section
13ab: outer circumference section
14, 15: support point
20, 20A through H: support jig
21, 21': supporting plate
22: supporting section
23: outer-circumference supporting section
30: support jig

What is claimed is:

1. A support method for supporting a support substrate to which a wafer is attached, comprising supporting the support substrate against gravitational force by supporting four or more support points of an inner circumference section of a support surface of the support substrate, where the support surface is an opposite side of a side on which the wafer is attached to the support substrate, and wherein the four or more support points are two groups of support points, each of which are located on a corresponding circumference of two respective circles concentric with the support surface of the support substrate and having different radii, and wherein a diametric line passing through two support points in one group located on one of the circumferences of the circles extends orthogonally to a diametric line passing through two support points in the other group located on the other one of the circumferences of the circles.

2. The method of claim 1, wherein at least three of the four or more support points are arranged at regular intervals on a circumference of a circle concentric with a circular shape of the support surface.

3. The method of claim 1, wherein one of the four or more support points is located at a center point of the circular shape of the support surface.

4. A high-temperature treatment method, comprising performing a high-temperature treatment to a wafer which is attached to a support that is supported by the method of claim 1.

5. A support method for supporting a support substrate to which a wafer is attached, comprising supporting the support substrate against gravitational force by supporting (i) one or more support points of an inner circumference section of a support surface of the support substrate, wherein the one or more support points of the inner circumference section is located at a center point of a circular shape of the support substrate, and (ii) three or more support points of an outer circumference section of the support surface of the support substrate, where the support surface is opposite to a side on which the wafer is attached to the support substrate, and where the three or more support points of the outer circumference section of the support surface of the support substrate are arranged at irregular intervals in the outer circumference section of the support surface of the support substrate.

6. A high-temperature treatment method, comprising performing a high-temperature treatment to a wafer which is attached to a support that is supported by the method of claim 5.

* * * * *